(12) United States Patent
Eberhard et al.

(10) Patent No.: US 8,896,019 B2
(45) Date of Patent: Nov. 25, 2014

(54) THIN-FILM ENCAPSULATION, OPTOELECTRONIC SEMICONDUCTOR BODY COMPRISING A THIN-FILM ENCAPSULATION AND METHOD FOR PRODUCING A THIN-FILM ENCAPSULATION

(75) Inventors: Franz Eberhard, Regensburg (DE); Sebastian Taeger, Regensburg (DE); Korbinian Perzlmaier, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 148 days.

(21) Appl. No.: 13/821,281

(22) PCT Filed: Aug. 16, 2011

(86) PCT No.: PCT/EP2011/064098
§ 371 (c)(1),
(2), (4) Date: May 2, 2013

(87) PCT Pub. No.: WO2012/031858
PCT Pub. Date: Mar. 15, 2012

(65) Prior Publication Data
US 2013/0292736 A1   Nov. 7, 2013

(30) Foreign Application Priority Data

Sep. 8, 2010  (DE) .......................... 10 2010 044 738

(51) Int. Cl.
*H01L 33/44* (2010.01)
*H01L 33/52* (2010.01)
*H01L 33/56* (2010.01)
*H01L 33/42* (2010.01)
H01L 33/46 (2010.01)

(52) U.S. Cl.
CPC ................ *H01L 33/52* (2013.01); *H01L 33/56* (2013.01); *H01L 33/42* (2013.01); *H01L 33/46* (2013.01); *H01L 2933/0016* (2013.01); *H01L 2933/005* (2013.01)

USPC ........ 257/100; 257/790; 257/E33.06; 438/26; 438/127; 438/694; 438/763

(58) Field of Classification Search
CPC ... H01L 21/56; H01L 23/561; H01L 23/3192; H01L 33/44; H01L 33/52; H01L 33/56; H01L 23/291; H01L 23/293
See application file for complete search history.

(56) References Cited

U.S. PATENT DOCUMENTS 7,452,739 B2 * 11/2008 Chu et al. .......... 438/33
7,687,322 B1 * 3/2010 Doan et al. ....... 438/141

(Continued)

FOREIGN PATENT DOCUMENTS

DE   10 2005 029 272 A1   10/2006
DE   10 2007 052 181 A1   4/2009
EP            0 164 092       12/1985

OTHER PUBLICATIONS

Chemische Gasphasenabscheidung (English Translation: Chemical Vapor Deposition), http://de.wikipedia.org/wiki/Chemische_Gasphasenabscheidung (English Translation: http://en.wikipedia.org/wiki/Chemical_vapor_deposition) (4 sheets).

(Continued)

*Primary Examiner* — Julio J Maldonado
*Assistant Examiner* — Molly Reida
(74) *Attorney, Agent, or Firm* — DLA Piper LLP (US)

(57) ABSTRACT

A thin-film encapsulation for an optoelectronic semiconductor body includes a PVD layer deposited by a PVD method, and a CVD layer deposited by a CVD method, wherein the CVD layer is applied directly on the PVD layer, and the CVD layer is etched back such that the CVD layer only fills weak points in the PVD layer.

17 Claims, 5 Drawing Sheets

(56) References Cited

U.S. PATENT DOCUMENTS

| | | | |
|---|---|---|---|
| 7,723,718 B1* | 5/2010 | Doan et al. | 257/14 |
| 8,124,454 B1* | 2/2012 | Chu et al. | 438/110 |
| 8,236,424 B2* | 8/2012 | Schaepkens et al. | 428/412 |
| 8,389,983 B2* | 3/2013 | Seo et al. | 257/40 |
| 8,507,302 B1* | 8/2013 | Chu et al. | 438/33 |
| 8,614,449 B1* | 12/2013 | Fan et al. | 257/79 |
| 8,778,780 B1* | 7/2014 | Doan et al. | 438/463 |
| 2002/0009888 A1* | 1/2002 | Mizumura | 438/694 |
| 2003/0102484 A1 | 6/2003 | Hata et al. | |
| 2003/0129298 A1* | 7/2003 | Tera et al. | 427/66 |
| 2004/0229051 A1* | 11/2004 | Schaepkens et al. | 428/447 |
| 2005/0001222 A1 | 1/2005 | Kurahashi et al. | |
| 2006/0065953 A1* | 3/2006 | Kim et al. | 257/620 |
| 2006/0071228 A1* | 4/2006 | Sun | 257/99 |
| 2006/0105542 A1* | 5/2006 | Yoo | 438/455 |
| 2006/0250084 A1 | 11/2006 | Cok et al. | |
| 2007/0293042 A1* | 12/2007 | Kim et al. | 438/669 |
| 2008/0128721 A1* | 6/2008 | Watanabe et al. | 257/96 |
| 2008/0272367 A1 | 11/2008 | Cok | |
| 2008/0305631 A1* | 12/2008 | Hirao | 438/680 |
| 2009/0202743 A1* | 8/2009 | Schaepkens et al. | 427/576 |
| 2010/0314642 A1* | 12/2010 | Kudo et al. | 257/98 |
| 2011/0068363 A1* | 3/2011 | Watanabe et al. | 257/100 |
| 2011/0140164 A1* | 6/2011 | Seo et al. | 257/100 |
| 2012/0012883 A1* | 1/2012 | Aoyama et al. | 257/98 |
| 2014/0048822 A1* | 2/2014 | Slater et al. | 257/76 |

OTHER PUBLICATIONS

The Korean Examination Report dated Jan. 17, 2014 for corresponding Korean Application No. 10-2013-7008806.

* cited by examiner

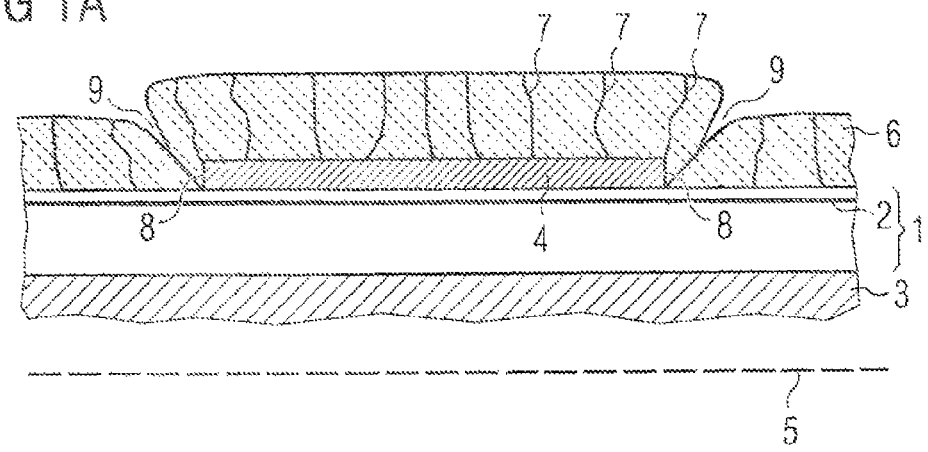
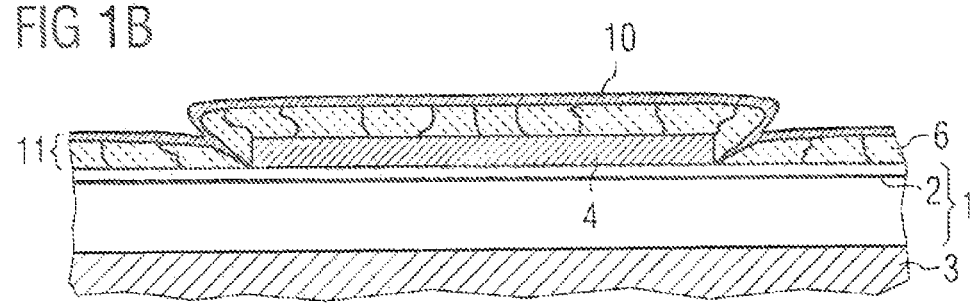
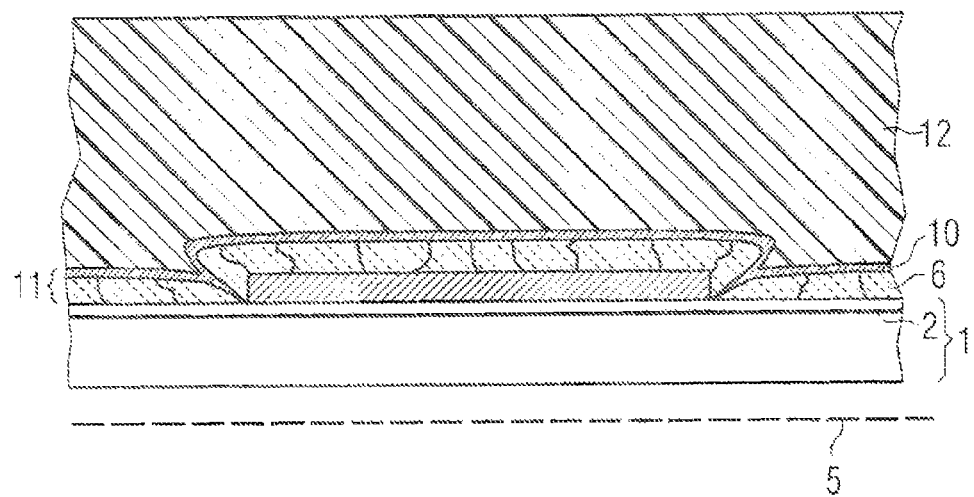

US 8,896,019 B2

THIN-FILM ENCAPSULATION, OPTOELECTRONIC SEMICONDUCTOR BODY COMPRISING A THIN-FILM ENCAPSULATION AND METHOD FOR PRODUCING A THIN-FILM ENCAPSULATION

RELATED APPLICATIONS

This is a §371 of International Application No. PCT/EP2011/064098, with an international filing date of Aug. 16, 2011 (WO 2012/031858 A1, published Mar. 15, 2012), which is based on German Patent Application No. 10 2010 044 738.2 filed Sep. 8, 2010, the subject matter of which is incorporated herein by reference.

TECHNICAL FIELD

This disclosure relates to a thin-film encapsulation, an optoelectronic semiconductor body comprising a thin-film encapsulation and a method of producing a thin-film encapsulation.

BACKGROUND

There is a need for a thin-film encapsulation, in particular for an optoelectronic semiconductor body, suitable to encapsulate well surfaces having topographical unevennesses. Also, there is a need for an optoelectronic semiconductor body comprising such a thin-film encapsulation and a method of producing such a thin-film encapsulation.

SUMMARY

We provide a thin-film encapsulation for an optoelectronic semiconductor body including a PVD layer deposited by a PVD method, and a CVD layer deposited by a CVD method, wherein the CVD layer is applied directly on the PVD layer, and the CVD layer is etched back such that the CVD layer only fills weak points in the PVD layer.

We also provide an optoelectronic semiconductor body including a thin-film encapsulation, which encapsulates a metallic element of the semiconductor body.

We further provide a method for producing a thin-film encapsulation including depositing a PVD layer by a PVD method, and depositing a CVD layer by a CVD method, wherein the CVD layer is applied directly on the PVD layer, and the CVD layer is etched back such that the CVD layer only fills weak points in the PVD layer.

BRIEF DESCRIPTION OF THE DRAWINGS

FIGS. 1A to 1C show schematic sectional illustrations of an optoelectronic semiconductor body during different method stages for producing a thin-film encapsulation in accordance with one example.

DETAILED DESCRIPTION

Figure 2:
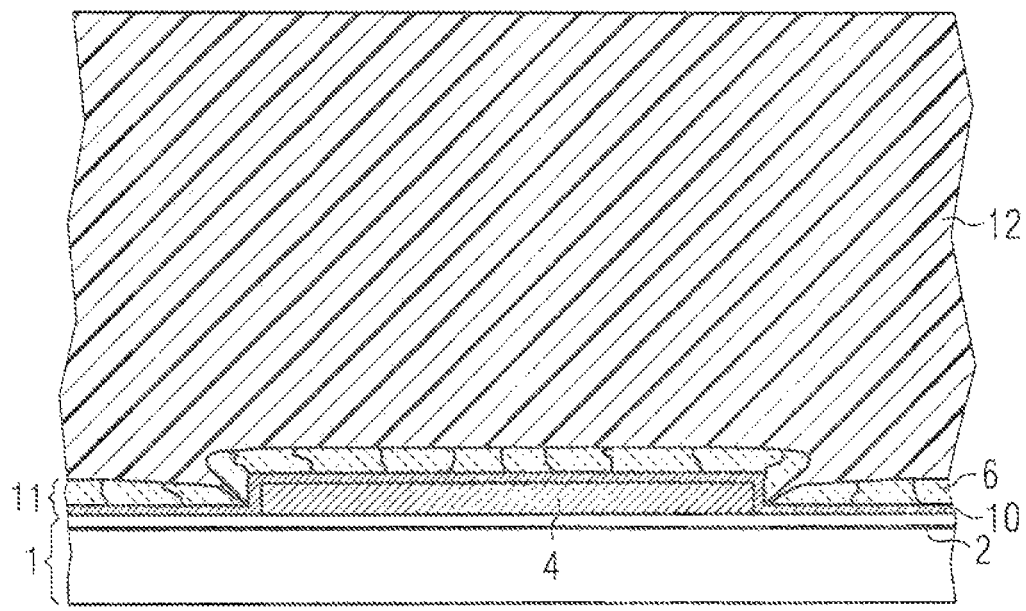
FIG. 2 shows a schematic sectional illustration of an optoelectronic semiconductor body comprising a thin-film encapsulation in accordance with a further example.

We provide a thin-film encapsulation for an optoelectronic semiconductor body comprising, in particular, the following layers:
a PVD layer deposited by a PVD method, and
a CVD layer deposited by a CVD method.

In a PVD method ("physical vapor deposition"), the surface to be coated is made available in a volume, for example, in a vacuum chamber. A starting material in the gas phase is furthermore provided in the volume. The starting material condenses directly on the surface and thus forms a solid PVD layer on the surface.

The PVD methods include, in particular, thermal evaporation in which the starting material is converted to the gas phase by application of temperature and sputtering, in which the starting material is converted to the gas phase by ion bombardment. Furthermore, electron beam evaporation in which the starting material is converted to the gas phase with the aid of an electron beam is also a PVD method. In general, PVD layers typically exhibit grain boundaries, wherein the diffusion coefficient of the PVD layer along the grain boundaries is generally significantly higher than in the volume material.

In a CVD method ("chemical vapor deposition"), the surface to be coated is likewise made available in a volume. At least one starting material from which a solid CVD layer is deposited by a chemical reaction at the surface to be coated is furthermore made available in the volume. In general, at least one second starting material with which the first starting material reacts chemically to form the solid CVD layer at the surface is situated in the volume. The CVD method is thus distinguished by at least one chemical reaction at the surface to be coated to form the CVD layer. In general, the chemical reaction takes place at a specific reaction temperature. Particularly preferably, the surface to be coated is at the reaction temperature at which the chemical reaction to form the solid CVD layer takes place. It is also possible to use more than two starting materials in chemical vapor deposition.

CVD methods are understood to include, in particular, the following methods: PECVD method ("plasma enhanced chemical vapor deposition"), MOCVD method ("metal organic chemical vapor deposition"), ALD method ("atomic layer deposition") and NLD method ("nano layer deposition").

In a PECVD method, generally a plasma is ignited in the volume during chemical deposition, while chemical deposition in an MOCVD method is carried out using at least one metallo-organic starting compound.

Atomic layer deposition (ALD) denotes a CVD method in which the first gaseous starting material is fed to the volume in which the surface to be coated is provided such that the first gaseous starting material adsorbs on the surface. After preferably complete or almost complete covering of the surface with an atomic or molecular layer of the starting material, the deposition is saturated and no more further material is deposited. Subsequently, that part of the first starting material still present in gaseous form or such that it has not adsorbed on the surface is generally removed again from the volume and the second starting material is fed in. The second starting material is provided to chemically react with the first starting, compound that has adsorbed at the surface to form a solid ALD layer. The two process steps described above are repeated a number of times until the desired thickness of the ALD layer is attained.

An NLD method denotes a CVD method in which layer growth of the CVD layer is interrupted once a predefined value of the layer thickness has been attained. The predefined value is preferably 0.5 nm to 5 nm. In a further step, the layer is subjected to a plasma treatment. In general, residues of the gaseous starting material that have reacted incompletely as a result of the plasma treatment and are generally organic in nature are advantageously removed. This generally has a positive influence on the layer properties. The CVD deposition and plasma treatment are repeated a number of times until the desired layer thickness of the Nu layer is attained.

In contrast to the ALD method, an NLD method makes it possible to deposit a CVD layer whose thickness exceeds one atomic layer in one process step.

A CVD method should furthermore be understood to include, in particular, a method in which, besides the surface to be coated, only a single gaseous starting material is made available in the volume, which starting, material reacts chemically with chemical groups of the surface to be coated to form the solid CVD layer. By way of example, gaseous hexamethyldisilazane (HMDS) can be made available as a starting material in the volume which forms a solid HMDS layer as a CVD layer with OH groups on a surface, for example, a semiconductor surface.

Structural weak points at topographical unevennesses can for during the PVD method in a PVD layer, for example, as a result of the starting material being incident obliquely on the surface to be coated, as a result of shading by the PVD layer that forms, or lack of surface mobility of the deposited starting material.

A central concept is to close structural weak points of the PVD layer which can be present in particular at topographical unevennesses of the surface to be coated, with the aid of a second layer. The structural weak points often have a high aspect ratio. Owing to high overforming, CVD methods are particularly suitable for the closure.

The thin-film encapsulation described here is advantageously generally hermetically impermeable toward aggressive liquids such as are used, for example, in wet-chemical processes in semiconductor technology. Furthermore, the thin-film encapsulation is preferably substantially gastight and generally prevents diffusion of atoms or ions, for example, metal ions.

Particularly preferably, the thin-film encapsulation comprising a CVD and PVD layer is suitable to encapsulate surfaces having unevennesses which have an aspect ratio of greater than 20:1 hermetically impermeably toward environmental influences, in particular liquids. However, the thin-film encapsulation is also suitable to reliably encapsulate structured surfaces having smaller aspect ratios.

Particularly preferably, the PVD and CVD layers form a common interface, that is to say that the PVD and CVD layers are in direct contact with one another.

The PVD layer may be electrically conducting. As a result, it is possible in particular, to produce an electrically conducting thin-film encapsulation via which electrical contact can advantageously be made with a semiconductor body to be encapsulated.

The thickness of the PVD layer is preferably 50 nm to 400 nm.

The PVD layer may comprise at least one of the following materials or consists of one of the following materials: titanium, tungsten, titanium-tungsten, titanium nitride, tungsten nitride, titanium-tungsten nitride, platinum, nickel, gold and tantalum. A PVD layer which comprises one of the materials or consists of one of the materials is generally electrically conducting.

The thickness of the CVD layer is preferably 2 nm to 20 nm.

The CVD layer may comprise one of the following materials or consists of one of the following materials: silicon, silicon oxide, silicon nitride and titanium nitride. A CVD layer which comprises silicon, silicon oxide or silicon nitride or consists of one of those materials is generally electrically insulating.

The CVD layer may comprise an electrically insulating material or consists of one of the materials. Electrically insulating materials can advantageously generally be deposited significantly more cost-effectively and with less operational outlay by a CVD method ban electrically conducting materials such as titanium nitride, for example.

Furthermore, it is also possible for the thin-film encapsulation to be constructed from a plurality of CVD and PVD layers arranged alternately. In this case, it is not absolutely necessary for the PVD and CVD layers to comprise the same material and/or to have the same thickness.

The CVD layer may be applied to the PVD layer in direct contact, and the CVD layer may be etched back such that the CVD layer only fills structural weak points in the PVD layer. In this way, even with a CVD layer comprising an insulating material, it is advantageously possible to obtain an electrically conductive thin-film encapsulation if an electrically conductive material is used for the PVD layer.

Particularly preferably, the PVD layer is situated in direct contact with the surface of the semiconductor body to be encapsulated. Preferably, the thin-film encapsulation furthermore comprises only a single CVD layer and only a single PVD layer. Particularly preferably, the thin-film encapsulation consists of a single CVD layer and a single PVD layer.

Etching-back the CVD layer in the area is preferably carried out by a directional etching method such as back-sputtering, for example. In this case, a directional method should be understood to mean that the etching is effected directionally which means that material is removed anisotropically from the etched surface.

Etching-back is preferably carried out such that the CVD layer is reliably removed again on those parts of the coated surface which have no topographical unevennesses and/or gaps, whereas the material of the CVD layer remains in the structural weak points. What is advantageous about this approach is the large choice of CVD materials. In particular, it is thus possible to use insulating materials for the CVD layer such as silicon nitride, for example, wherein an electrically conducting thin-film encapsulation can nevertheless be obtained.

A further PVD layer, likewise deposited by a PVD method, may be arranged on the etched-back CVD layer.

The CVD layer may be deposited directly on the semiconductor body to be coated. The PVD layer is arranged above the CVD layer, preferably in direct contact with the CVD layer. In this case, the PVD layer serves to protect the CVD layer against mechanical and/or chemical attacks.

The thin-film encapsulation is suitable in particular for use in an optoelectronic, preferably radiation-emitting, semiconductor body. Particularly preferably, the thin-film encapsulation encapsulates a metallic element of the semiconductor body such as, for instance, an electrical contact or a reflective layer, with respect to environmental influences. In this case, the thin-film encapsulation is generally integrated into the semiconductor body. Particularly preferably, the thin-film encapsulation is applied in direct contact to the element to be encapsulated.

Furthermore, the thin-film encapsulation is suitable for impermeably encapsulating ground surfaces, such as ground wafer surfaces for example, which are generally greatly fissured on account of grinding grooves.

In the optoelectronic semiconductor body, the metallic element may comprise at least one of the following materials or consists of at least one of the following materials: silver, aluminum, gold, titanium and nickel.

A reflective metallic layer can be provided, for example, for reflecting electromagnetic radiation generated in an active zone of an epitaxial semiconductor layer sequence of the semiconductor body.

The thickness of the metallic layer is preferably 50 nm to 250 nm.

Preferably, the reflective metallic layer does not completely cover the epitaxial semiconductor layer sequence, but rather leaves free laterally at least partial regions of the epitaxial semiconductor layer sequence. As a result, an edge constituting a topographical unevenness arises on the semiconductor layer sequence—metallic layer surface.

The metallic layer, in particular, is sensitive, for example, to wet-chemical processes during production of the semiconductor body. For this purpose, the metallic layer has to be reliably encapsulated at least against liquids. In particular a thin-film encapsulation such as has been described above is suitable for this purpose.

The optoelectronic semiconductor body can be, for example, a light-emitting diode or particularly preferably a thin-film light-emitting diode. In this case, a thin-film light-emitting diode is understood to be a light-emitting diode in which the growth substrate for epitaxially growing, the epitaxial semiconductor layer sequence is removed from the epitaxial semiconductor layer sequence or thinned such that the growth substrate alone is no longer suitable to mechanically stabilize the epitaxial semiconductor layer sequence. For this purpose, in the case of a thin-film light-emitting diode, provision is made of a separately applied carrier arranged on or above the metallic layer.

Our method for producing a thin-film encapsulation comprises, in particular, the following, steps:
  depositing a PVD layer by a PVD method, and
  depositing a CVD layer by a CVD method.

Moreover, the features described above in connection with a thin-film encapsulation can also be part of the production method.

Further advantages and developments will become apparent from the examples described below in conjunction with the figures.

Elements that are identical, of identical type or act identically are provided with the same reference signs in the figures. The figures and the size relationships of the elements illustrated in the figures among one another should not be regarded as to scale. Rather, individual elements, in particular layer thicknesses, may be illustrated with an exaggerated size to enable better illustration and/or afford a better understanding.

The optoelectronic semiconductor body in accordance with the example in FIG. 1A comprises an epitaxial semiconductor layer sequence 1 having an active zone 2 to generate radiation.

The active zone 2 preferably comprises a pn junction, a double heterostructure, single quantum well or particularly preferably a multiple quantum well structure (MQW) to generate radiation. In this case, the designation quantum well structure does not include any indication about the dimensionality of the quantization. It therefore encompasses, inter alia, quantum wells, quantum wires and quantum dots and any combination of these structures.

The epitaxial semiconductor layer sequence 1 is grown epitaxially on a growth substrate 3.

A metallic layer 4 as metallic element is applied in direct contact to that side of the epitaxial semiconductor layer sequence 1 situated opposite the growth substrate 3, the metallic layer reflecting radiation of the active one 2. In this case, the metallic layer 4 is preferably formed from silver or comprises silver. The thickness of the metallic layer 4 is generally 50 nm to 250 nm. The metallic layer 4 is provided to reflect radiation generated in the active zone 2 to a radiation-emitting front side 5 of the semiconductor body.

In this case, the metallic layer 4 is not applied over the entire surface of the epitaxial semiconductor layer sequence 1, but rather covers only a partial region of the surface of the epitaxial semiconductor layer sequence 1. Laterally with respect to the metallic layer 4, partial regions of the surface of the epitaxial semiconductor layer sequence 1 are free of the metallic layer 4.

A PVD layer 6 deposited by a PVD method is arranged on the metallic layer 4 and the laterally exposed surface of the epitaxial semiconductor layer sequence 1. The PVD layer 6 is in direct contact with the metallic layer 4 and with the surface of the epitaxial semiconductor layer sequence 1.

The PVD layer 6 preferably has a thickness of 50 nm to 400 nm. The PVD layer 6 is electrically conducting. It comprises titanium-tungsten nitride, for example. Alternatively, the PVD layer 6 can also comprise one of the following materials or consist of one of the following materials: titanium, tungsten, titanium-tungsten, titanium nitride, tungsten nitride, titanium-tungsten nitride, platinum, nickel, gold and tantalum. On account of its production process, the PVD layer 6 has grain boundaries 7.

On account of the thickness of the metallic layer 4, there is present in each case an edge 8 in the surface of the semiconductor body at the transition from the metallic layer 4 to the epitaxial semiconductor layer sequence 1. On account of the topographical unevennesses formed by the two edges 8, the PVD layer 6 has gaps 9 at these points.

To fill the gaps 9 within the PVD layer 6, in a next method step, a CVD layer 10 is then deposited in direct contact onto the PVD layer 6 by a CVD method (FIG. 1B). In this case, the PVD layer 6 and the CVD layer 10 form a thin-film encapsulation 11.

If the intention is to obtain an electrically conducting thin-film encapsulation 11, for example, to be able to electrically contact the epitaxial semiconductor layer sequence 1 by the thin-film encapsulation 11, then the CVD layer 10 is formed from an electrically conducting starting material such as titanium nitride, for example. The thickness of the CVD layer 10 is preferably 2 nm to 20 nm. The CVD layer 10 fills the gaps 9 in the underlying PVD layer 6 and also seals the grain boundaries 7. In this way, the thin-film encapsulation 11 reliably seals the sensitive metallic layer 4 in particular relative to liquids.

In a further step, a carrier 12 is arranged on or above the thin-film encapsulation 11 and the growth substrate 3 is removed or thinned such that it alone no longer sufficiently mechanically stabilizes the epitaxial semiconductor layer sequence 1. Instead of the growth substrate 3, the carrier 12 mechanically stabilizes the epitaxial semiconductor layer sequence 1 (FIG. 1C).

In contrast to the optoelectronic semiconductor body in accordance with the example in FIG. 1C, the optoelectronic semiconductor body in accordance with the example in FIG. 2 comprises a thin-film encapsulation 11 wherein the CVD layer 10 is in direct contact with the metallic layer 4. Furthermore, the CVD layer 10 is also arranged laterally with respect to the metallic layer 4 on the surface of the epitaxial semiconductor layer sequence 1. A PVD layer 6 is furthermore arranged in direct contact onto the CVD layer 10. In this case, the PVD layer 6 serves to protect the CVD layer 10 against mechanical and chemical attacks.

Figure 3A:
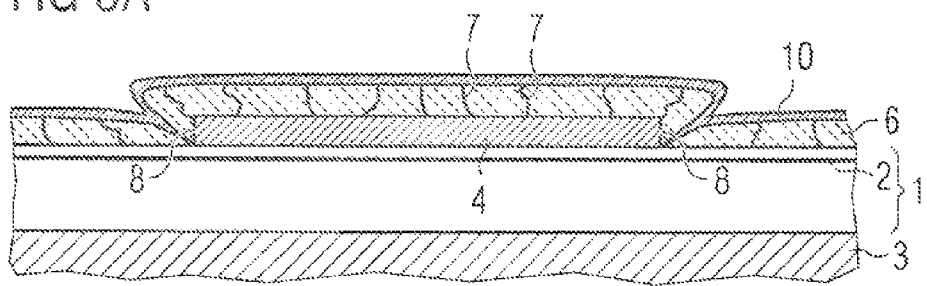
FIGS. 3A, 3B and 3C show schematic sectional illustrations of optoelectronic semiconductor bodies during the production of a thin-film encapsulation in accordance with a further example during different method stages.

In the case of the optoelectronic semiconductor body in accordance with the example in FIG. 3A, the CVD layer 10, in contrast to the method stage in accordance with FIG. 1B, is electrically insulating. For this purpose, the CVD layer 10 preferably comprises silicon nitride or consists of silicon nitride.

Figure 3B:
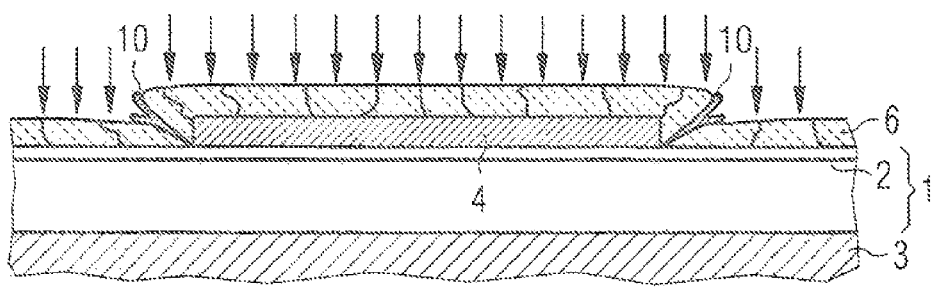

In a next method step, as can be seen in FIG. 3B, the electrically insulating CVD layer 10 is etched back by a directional method, for example, sputtering.

Those parts of the surface of the PVD layer 6 having no weak points on account of underlying edges 8 are completely exposed during the etching-back. Only the gaps 9 in each case laterally with respect to the metallic layer 4 which arose on account of the height difference between metallic layer 4 and epitaxial semiconductor layer sequence 1 in the PVD method 6, are still hermetically impermeably filled with the material of the CVD layer 6.

Figure 3C:
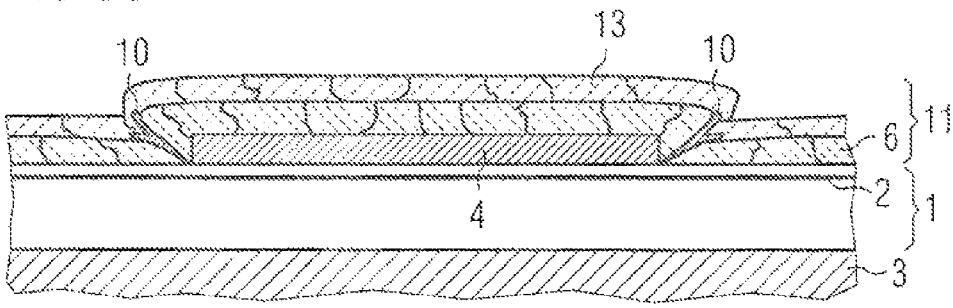

In a further method step, a further PVD layer 13 is deposited by a PVD method (FIG. 3C). This further PVD layer 13 is situated on the free surfaces of the first PVD layer 6 in direct contact with the latter. The further PVD layer 13 can be configured like the first PVD layer 6, for example.

Figure 4:
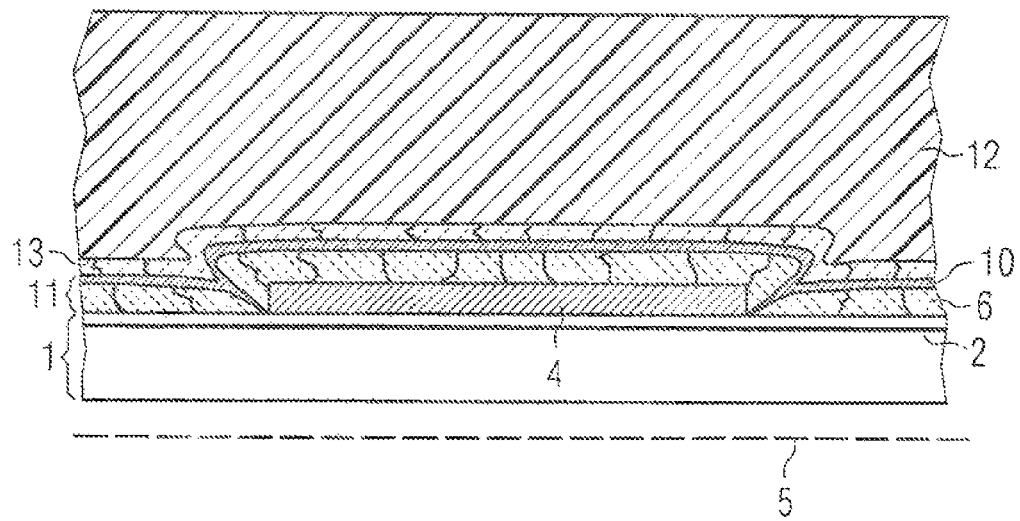
FIG. 4 shows a schematic sectional illustration of a semiconductor body comprising a thin-film encapsulation in accordance with a further example.

The thin-film encapsulation 11 in the case of the semiconductor body in accordance with the example in FIG. 4 comprises a PVD layer 6 which was deposited in direct contact onto the metallic layer 4 by a PVD method. The PVD layer 6 has a thickness of approximately 100 nm, for example, and is formed from titanium-tungsten nitride. A CVD layer 10 is deposited in direct contact onto the PVD layer 6 by a CVD method. The CVD layer 10 has a thickness of approximately 10 nm, for example, and is formed from titanium nitride. A further PVD layer 13 is deposited in direct contact onto the CVD layer 10 by a PVD method. In this example, the further PVD layer 13 is configured like the first PVD layer 6. Alternatively, it is also possible for the further PVD layer 13 to differ from the PVD layer 6 with regard to material composition and/or thickness. The thin-film encapsulation 11 is formed by the first PVD layer 6, the CVD layer 10 and the further PVD layer 13. Since the first PVD layer 6, the CVD layer 10 and the further PVD layer 13 are formed from electrically conducting materials, the thin-film encapsulation 11 is also electrically conducting.

Figure 5A:
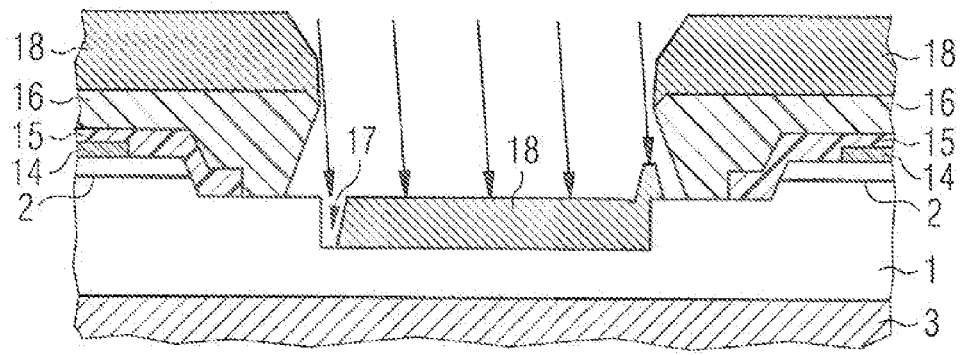
FIGS. 5A, 5B and 5C show schematic sectional illustrations of a semiconductor body during manufacturing steps in which a thin-film encapsulation in accordance with a further example is produced.
Figure 5B:
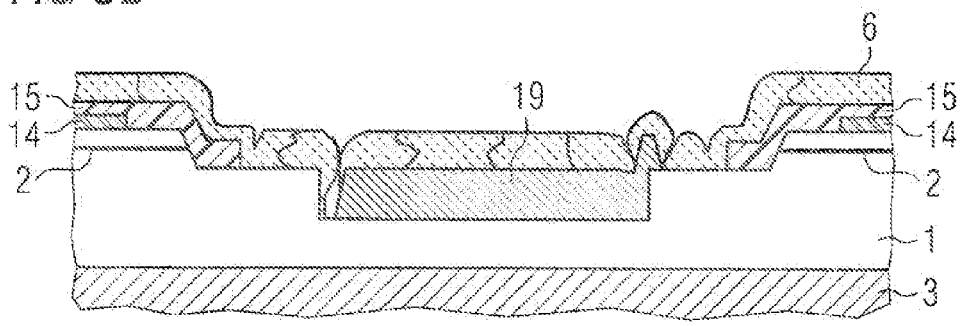
Figure 5C:
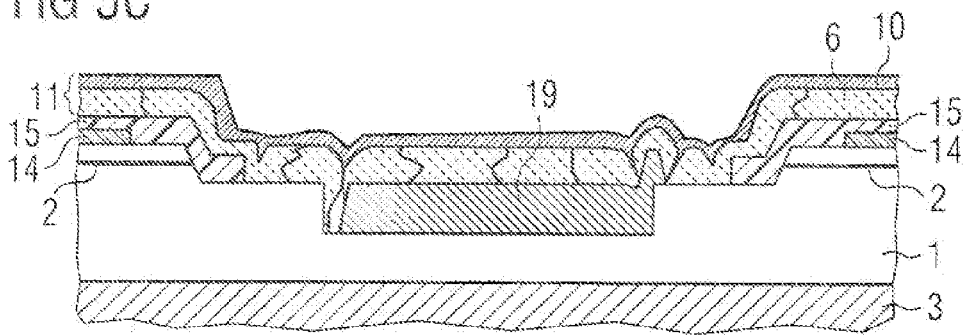

The optoelectronic semiconductor body produced in the method in accordance with the example in FIGS. 5A to 5C comprises a semiconductor layer sequence 1 having an active zone 2 that generates electromagnetic radiation. The semiconductor layer sequence 1 is grown epitaxially on a growth substrate 3. The semiconductor layer sequence 1 has a stepped cutout which penetrates through the active zone 2 and was produced in a previous method step, for example, by dry etching.

Laterally with respect to the stepped cutout, a first electrical contact 14 is arranged onto the semiconductor layer sequence 1, which first electrical contact can also be arranged in a manner extending circumferentially around the entire semiconductor body. The first electrical contact 14 can be a p-type contact, for example. Furthermore, an insulating layer 15 comprising silicon oxide, for example, or formed from silicon oxide is applied on the p-type contact. A photoresist layer 16 is applied on the insulating layer 15, the photoresist leaving tree a central depression 17 of the stepped cutout.

In the central depression 17 of the stepped cutout, a metallic material 18 that forms a second electrical contact 19, for example, an n-type contact, is deposited during the method step in FIG. 5A. The metallic material 18 can be deposited by electron beam evaporation or thermal evaporation, for example. As indicated by the arrows in FIG. 5A, application of material can in this case take place slightly obliquely. As a result, a region free of metallic material 18 arises at one side area of the central depression 17, while an excess of material accumulates at the other side area. In this way, topographical unevennesses form at the side areas of the central depression 17.

The second electrical contact 19 formed by deposition of the metallic material 18 in the central depression 17 constitutes a metallic element which, for example, comprises one of the following materials or consists of one of the following materials: silver, aluminum, gold, titanium and nickel.

In a next method step not illustrated), the photoresist layer 16 is removed.

In a further method step that encapsulates the second electrical contact 19, a PVD layer 6 is deposited above the semiconductor body, as shown in FIG. 5B. The PVD layer 6 is arranged in direct contact onto the second metallic contact. At the topographical unevennesses, weak points can form in the PVD layer 6.

In a further method step illustrated in FIG. 5C, therefore, a CVD layer 10 is deposited in direct contact onto the PVD layer 6, the CVD layer hermetically closing weak points. The thin-film encapsulation 11 composed of the PVD layer 6 and the CVD layer 10 is electrically conducting, such that electrical contact can be made with the active zone 2 through the thin-film encapsulation 11.

In a further method step not illustrated, a carrier, for example, composed of germanium or silicon, is generally applied at the rear side over the CVD layer 10. The carrier is generally connected to the CVD layer 10 by a suitable solder. The growth substrate 3 is subsequently removed from the epitaxial semiconductor layer sequence 1. The resultant exposed side of the semiconductor body is generally provided as the radiation exit area.

Our encapsulations, bodies and methods are not restricted to the examples on the basis of those examples. Rather, this disclosure encompasses any novel feature and also any combination of features which in particular includes any combination of features in the appended claims, even if the feature or combination itself is not explicitly specified in the claims or examples.

The invention claimed is:

1. A thin-film encapsulation, for an optoelectronic semiconductor or body comprising:
    a PVD layer deposited by a PVD method, and
    a CVD layer deposited by a CVD method,
    wherein
    the CVD layer is applied directly on the PVD layer, and
    the CVD layer is etched back such that the CVD layer only fills weak points in the PVD layer,
    wherein the PVD layer and CVD layer are a part of a thin-film encapsulation over a semiconductor body.

2. The thin-film encapsulation according to claim 1, wherein the PVD layer is electrically conducting.

3. The thin-film encapsulation according to claim 1, wherein the thickness of the PVD layer is 50 nm to 400 nm.

4. The thin-film encapsulation according to claim 1, wherein the PVD layer is at least one selected from the group consisting of titanium, tungsten, titanium-tungsten, titanium nitride, tungsten nitride, titanium-tungsten nitride, platinum, nickel, gold and tantalum.

5. The thin-film encapsulation according to claim 1, wherein the thickness of the CVD layer is 2 nm to 20 nm.

6. The thin-film encapsulation according to claim 1, wherein the CVD layer is at least one selected from the group consisting of silicon, silicon oxide, silicon nitride and titanium nitride.

7. The thin-film encapsulation according to claim 1, which comprises a plurality of CVD layers and PVD layers arranged alternately.

8. The thin-film encapsulation according to claim 1, wherein a further PVD layer deposited by a PVD method is arranged on the etched-back CVD layer.

9. The thin-film encapsulation according to claim 1, wherein the CVD layer comprises an electrically insulating material.

10. An optoelectronic semiconductor body comprising a thin-film encapsulation according to claim 1, which encapsulates a metallic element of the semiconductor body.

11. The optoelectronic semiconductor body according to claim 10, wherein the metallic element is an electrical contact or a reflective layer.

12. The optoelectronic semiconductor body according to claim 10, wherein the metallic element is at least one selected from the group consisting of silver, aluminum, gold, titanium and nickel.

13. A method for producing a thin-film encapsulation comprising:
   depositing a PVD layer by a PVD method, and
   depositing a CVD layer by a CVD method,
   wherein
   the CVD layer is applied directly on the PVD layer, and
   the CVD layer is etched back such that the CVD layer only fills weak points in the PVD layer,
   wherein the PVD layer and CVD layer are a part of a thin-film encapsulation over a semiconductor body.

14. The method according to claim 13, wherein a further PVD layer deposited by a PVD method is arranged on the etched-back CVD layer.

15. The method according to claim 13, wherein the CVD layer comprises an electrically insulating material.

16. The method according claim 13, wherein the PVD layer is at least one selected from the group consisting of titanium, tungsten, titanium-tungsten, titanium nitride, tungsten nitride, titanium-tungsten nitride, platinum, nickel, gold and tantalum.

17. The method according to claim 13, wherein the CVD layer is at least one selected from the group consisting of silicon, silicon oxide, silicon nitride and titanium nitride.

* * * * *